(12) United States Patent
Yoon et al.

(10) Patent No.: US 8,273,668 B2
(45) Date of Patent: Sep. 25, 2012

(54) METHODS OF FORMING A PATTERN AND METHODS OF FABRICATING A SEMICONDUCTOR DEVICE HAVING A PATTERN

(75) Inventors: Dong Ki Yoon, Seoul (KR); Shiyong Yi, Hwaseong-si (KR); Kyoungseon Kim, Suwon-si (KR); Seongwoon Choi, Suwon-si (KR); Seokhwan Oh, Seoul (KR); Sang Ouk Kim, Daejeon (KR); Seung Hak Park, Bucheon-si (KR)

(73) Assignees: Samsung Electronics Co., Ltd., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 132 days.

(21) Appl. No.: 12/805,432

(22) Filed: Jul. 30, 2010

(65) Prior Publication Data
US 2011/0081777 A1    Apr. 7, 2011

(30) Foreign Application Priority Data
Oct. 7, 2009 (KR) .................. 10-2009-0095268

(51) Int. Cl.
*H01L 21/31* (2006.01)
*H01L 21/302* (2006.01)
(52) U.S. Cl. ......... 438/780; 438/689; 438/758; 438/761
(58) Field of Classification Search ................. None
See application file for complete search history.

(56) References Cited

U.S. PATENT DOCUMENTS

| | | | |
|---|---|---|---|
| 7,347,953 B2 | 3/2008 | Black et al. | |
| 7,976,715 B2* | 7/2011 | Dobisz et al. | 216/11 |
| 8,039,196 B2* | 10/2011 | Kim et al. | 430/270.1 |
| 8,053,163 B2* | 11/2011 | Yi et al. | 430/270.1 |
| 2007/0175859 A1 | 8/2007 | Black et al. | |
| 2008/0193658 A1 | 8/2008 | Millward | |
| 2008/0213956 A1* | 9/2008 | Black et al. | 438/197 |
| 2009/0042146 A1* | 2/2009 | Kim et al. | 430/323 |
| 2009/0087664 A1* | 4/2009 | Nealey et al. | 428/411.1 |
| 2009/0155725 A1* | 6/2009 | Yi et al. | 430/312 |
| 2009/0191713 A1* | 7/2009 | Yoon et al. | 438/703 |
| 2009/0239103 A1* | 9/2009 | Hasegawa et al. | 428/847.1 |

FOREIGN PATENT DOCUMENTS

| | | |
|---|---|---|
| JP | 2007208255 A | 8/2007 |
| JP | 2007313568 A | 12/2007 |

* cited by examiner

*Primary Examiner* — Scott B Geyer
(74) *Attorney, Agent, or Firm* — Harness, Dickey & Pierce, P.L.C.

(57) ABSTRACT

Methods of forming a pattern and methods of fabricating a semiconductor device having a pattern are provided, the methods include forming a self-assembly induction layer including a first region and a second region on a semiconductor substrate. A block copolymer layer is coated on the self-assembly induction layer. A first pattern, a second pattern and a third pattern are formed by phase separating the block copolymer. At least one of the first, second and third patterns may be removed to form a preliminary pattern. An etching process may be performed using the preliminary pattern as an etching mask. The first pattern contains the same material as that of the second pattern, and the third pattern contains a material different from that of the first pattern.

20 Claims, 16 Drawing Sheets

(a) Diblock Copolymer (b) Triblock Copolymer 11a 11b 11a 11b

PMMA(7c)
PS(7a)

PS(7a)

PMMA(7c)

METHODS OF FORMING A PATTERN AND METHODS OF FABRICATING A SEMICONDUCTOR DEVICE HAVING A PATTERN

CROSS-REFERENCE TO RELATED APPLICATIONS

This U.S. non-provisional patent application claims the benefit of priority under 35 U.S.C. §119 of Korean Patent Application 10-2009-0095268, filed on Oct. 7, 2009, the entire contents of which are hereby incorporated by reference.

BACKGROUND

1. Field

Example embodiments herein relate to methods of fabricating a semiconductor device having a pattern. Other example embodiments relate to methods of forming a pattern.

2. Related Art

As the integration of semiconductor devices increases, finer patterning is required. The width of a photoresist pattern capable of being realized by an exposure process may be determined according to following Rayleigh's equation, $$R=(k_1)\cdot(\lambda/NA)$$

wherein R represents resolution, $k_1$ represents a process constant, $\lambda$ represents a wavelength of light source and NA represents a numerical aperture of lens.

To reduce the resolution, the process constant $k_1$ should be smaller, the wavelength of light source $\lambda$ should be shorter, or the numerical aperture NA of lens should be increased. To make the wavelength of light source shorter than the wavelength of KrF (248-mm) or ArF (193-mm), an exposure process using an extreme ultraviolet (EUV) having a wavelength of 13.4-nm as a light source may be necessary. The exposure process using the EUV as the light source requires a vacuum condition and a reflective photomask, which may be different from the vacuum condition and the reflective photomask used in the related art processes. The exposure equipment using the EUV as the light source is very expensive. As such, there are some troubles in making use of the exposure equipment for the exposure process at this point.

Reduction in the wavelength of light source has limits. As an alternative, solutions that increase the numerical aperture NA of lens are being developed. The numerical aperture NA of lens may be proportional to n(sin θ), where n represents a refractive index of a medium between a lens and a photoresist. As such, the resolution increases as the refractive index of the medium increases. By using this principle, an immersion lithography process is proposed. In the immersion lithography process, the exposure process may be performed to increase resolution through a medium (having a refractive index higher than that of air). Water, which has a refractive index of 1.4, has a higher refractive index than air, which has a refractive index of 1. When the exposure process is performed using water as the medium, a photosensitive polymer, a photoacid generator and a solvent (which are contained in a photoresist coming in contact with the water) may be dissolved into the water. In this case, bubbles may be generated at a boundary between the water and the photoresist layer.

SUMMARY

Example embodiments herein relate to methods of fabricating a semiconductor device having a pattern. Other example embodiments relate to methods of forming a pattern.

Example embodiments provide a method of forming patterns that can overcome limits of an exposure process and form fine patterns.

Example embodiments of the inventive concepts provide a method of forming patterns, the method including forming a self-assembly induction layer having a first region and a second region on a semiconductor substrate, coating a block copolymer layer on the self-assembly induction layer, forming a first pattern, a second pattern, and a third pattern by phase separating the block copolymer, removing at least one of the first, second and third patterns to form a preliminary pattern, and performing an etching process using the preliminary pattern (which is not removed) from the first, second and third patterns as an etching mask. In this case, the first pattern contains the same material as that of the second pattern, and the third pattern contains a material different from that of the first pattern.

In example embodiments, the self-assembly induction layer may have different properties in the first region and the second region. The surface of the self-assembly induction layer may have a neutrality in the first region, and the surface of the self-assembly induction layer may have a polarity in the second region.

In example embodiments, forming the self-assembly induction layer may include forming a polar layer on the entire surface of the semiconductor substrate, and exposing the polar layer in the second region and forming a neutral layer pattern so as to be disposed in the first region. The self-assembly induction layer may include the polar layer and the neutral layer pattern.

In example embodiments, the method may further include before performing the etching process, performing an annealing process, and selectively depositing metal particles on the surface of the preliminary pattern.

In example embodiments, the first pattern may be formed in the first region so as to have a width smaller than that of the first region, and the second pattern may be formed in the second region so as to have a width smaller than that of the second region.

In example embodiments, the first pattern may have a cylindrical shape extending upward from the surface of the self-assembly induction layer, and the second pattern may have a semi-cylindrical shape that contacts the surface of the self-assembly induction layer.

In example embodiments, the third pattern may cover an upper surface of the second pattern and sidewalls of the first pattern but expose an upper surface of the first pattern.

In example embodiments, the first region may have a first width, and the second region may have a second width, and the ratio of the first width to the second width may be 2n+1:1, where n may be an integer that is 0 or more.

In example embodiments, the block copolymer layer may be at least one selected from a group including polystyrene-block-polymethymethacrylate, polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polydimethylsiloxane, polybutylmethacrylate-block-polybutylacrylate, polyethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethysiloxane-block-polystyrene, polystyrene-block-polyvinylpyridine-block-polystyrene, polyethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxide-block-polystyrene-block-polyethyleneoxide, polyethyleneoxide-block-polymethylmethacrylate-block-polyethyleneoxide, polyethyleneoxide-block-polydimethylsiloxane-block-polyethyleneoxide, polystyrene-block-polyethyleneoxide-block-polystyrene and combinations thereof.

In example embodiments, the neutral layer pattern may have a height of about 60-nm or less. In example embodiments, the neutral layer pattern may include at least one of a photoresist pattern and an imaging layer pattern.

In example embodiments, removal of at least one of the first, second and third patterns may include removing the third pattern, or simultaneously removing the first pattern and the second pattern.

In example embodiments, the third pattern may not be removed, and performing the etching process using the third pattern as the etching mask may include forming holes.

In example embodiments, the second pattern may not be removed, and performing the etching process using the second pattern as the etching mask may include forming a line-type lower pattern.

In example embodiments, the first pattern may not be removed, and performing the etching process using the first pattern as the etching mask may include forming a pillar-type lower pattern.

In example embodiments, the width of the first pattern may be equal to that of the second pattern.

BRIEF DESCRIPTION OF THE DRAWINGS

The accompanying drawings are included to provide a further understanding of example embodiments of the inventive concepts, and are incorporated in and constitute a part of this specification. The drawings illustrate example embodiments of the inventive concepts and, together with the description, serve to explain principles of example embodiments of the inventive concepts. In the drawings.

DETAILED DESCRIPTION OF EXAMPLE EMBODIMENTS

Figure 1A:
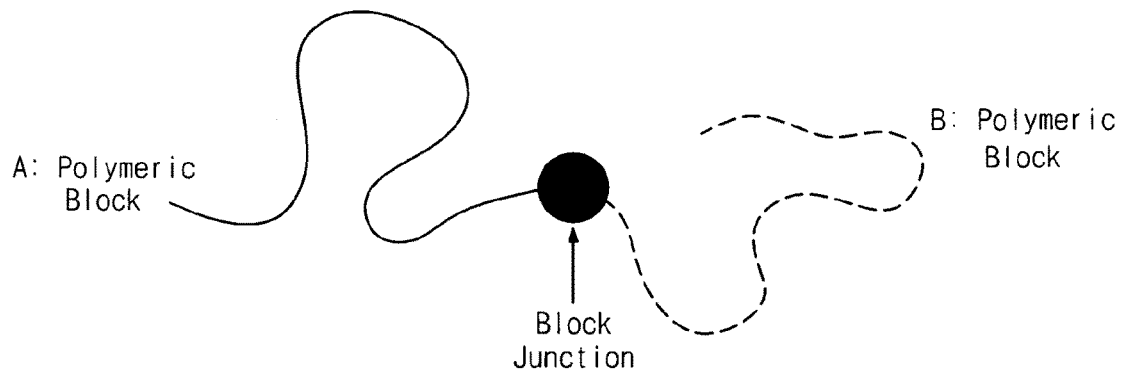
FIG. 1A is a diagram schematically illustrating a block copolymer.
Figure 1A:
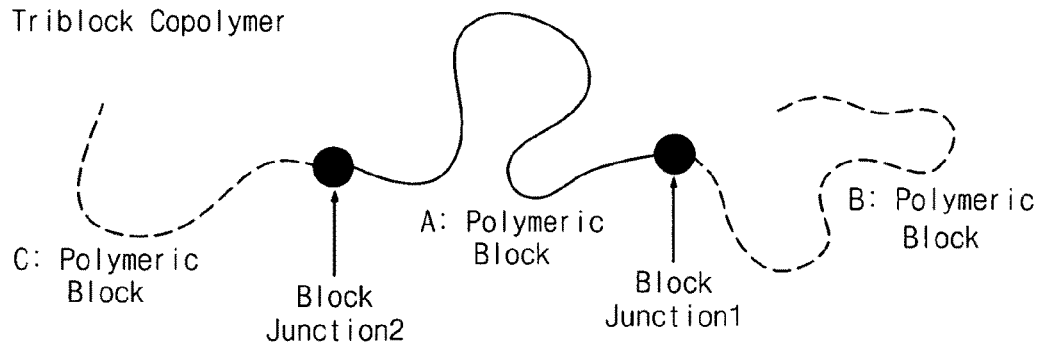

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments herein relate to methods of fabricating a semiconductor device having a pattern. Other example embodiments relate to methods of forming a pattern.

FIG. 1A is a diagram schematically illustrating a block copolymer.

Referring to FIG. 1A, ends of two or more polymeric blocks are connected to each other by a covalent bond in a block copolymer. The polymeric blocks have different properties from one another. A di-block copolymer is shown in FIG. 1A as an example of the block copolymer. However, example embodiments are not limited thereto. In the di-block copolymer, one end of a polymeric block A is bonded to one end of a polymeric block B by a covalent bond to form a block junction, whereas the other ends of the first and second polymeric blocks A and B, which are not bonded to each other by the block junction, repel each other. For instance, one of the polymeric blocks A and B is hydrophilic, and the other is hydrophobic. The hydrophilic polymeric block may have a polarity.

is the block copolymer may be a tri-block copolymer. In the tri-block copolymer, three polymeric blocks A, B and C form two block junctions BLOCK JUNCTION 1 and BLOCK JUNCTION 2. For instance, the polymeric block B and the polymeric block C are each bonded to an end of the polymeric block A by a covalent bond to form the block junctions, respectively. At this time, the polymeric block A may have different properties from those of the polymeric blocks B and C, which are bonded to respective ends thereof. The polymeric block B and the polymeric block C may have the same properties, for example, the same polymeric property.

Figure 1B:
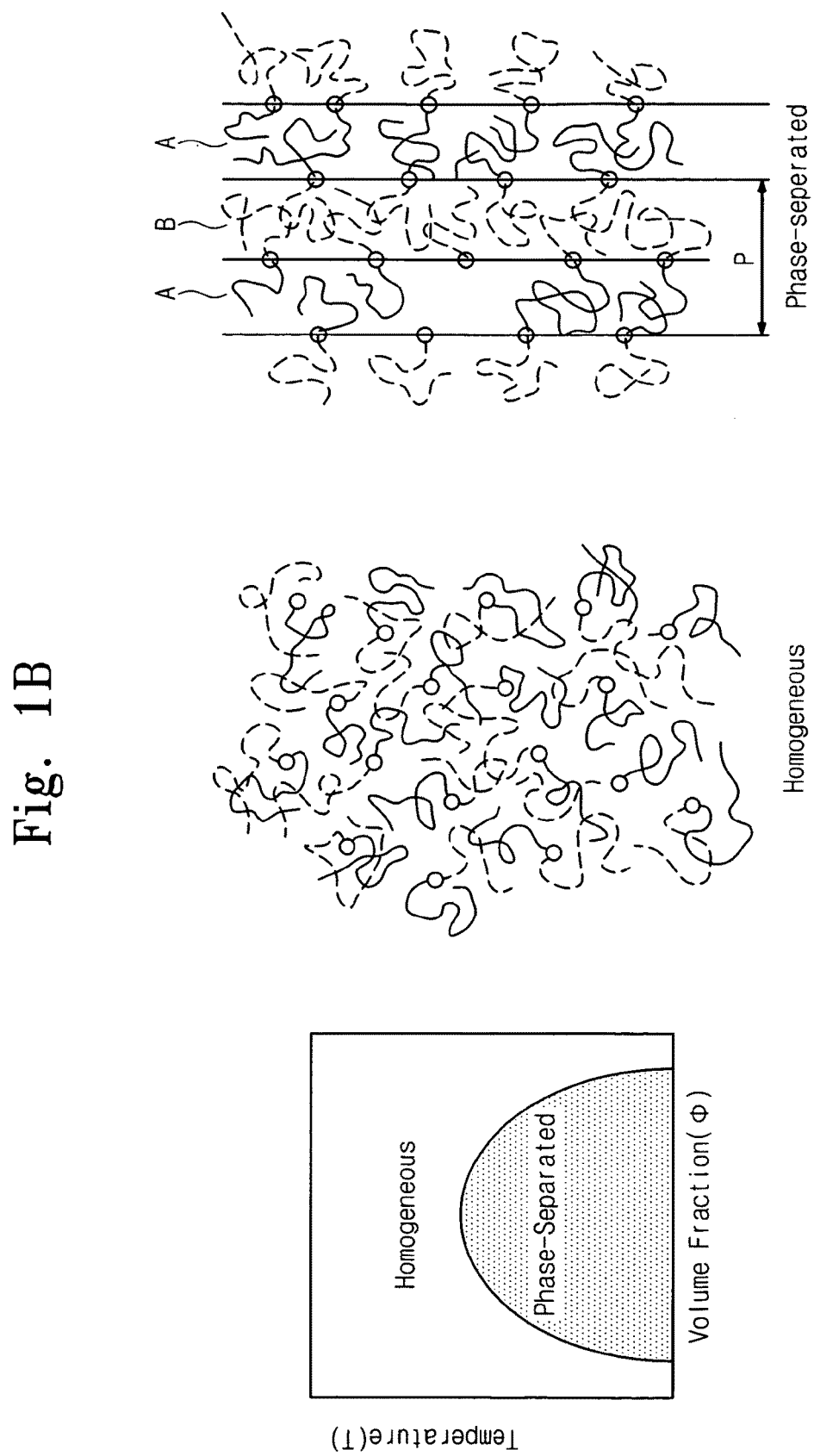
FIG. 1B is a diagram illustrating a state of a block copolymer according to volume fraction and temperature.

FIG. 1B is a diagram illustrating the state of the block copolymer according to volume fraction and temperature.

Referring to FIG. 1B, the di-block copolymer is changed into a microphase-separated state from a homogeneous state, when the temperature descends at a specific volume fraction Φ. The homogeneous state means that the first polymeric block A and the second polymeric block B are disorderly located. The microphase-separated state means that the first polymeric block A and the second polymeric block B are self-assembled to be separated into different domains. The pitch P between the first polymeric block domains A is constant at the microphase-separated state. That is, the width of the first polymeric block domain A and the width of the second polymeric block domain B are constant. At this time, the width of each of the polymeric block domains A and B may be determined by a molecular weight of each of the polymeric blocks.

Figure 1C:
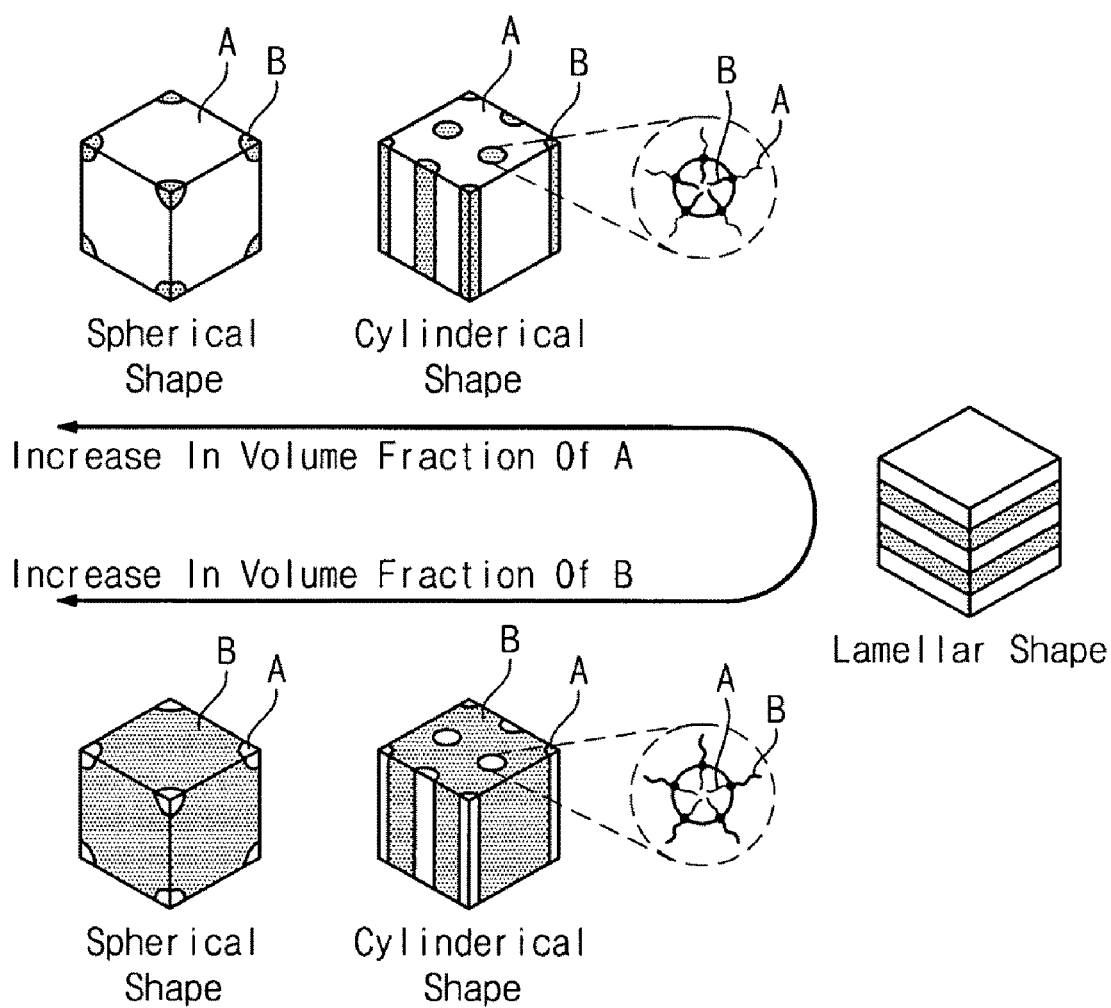
FIG. 1C is a diagram illustrating a change in shapes of a polymeric block domain according to a volume fraction.

FIG. 1C is a diagram illustrating a change in shapes of a polymeric block domain according to a volume fraction.

Referring to FIG. 1C, the shape of the polymeric block domain may vary according to the volume fraction Φ. Specifically, when the first polymeric block A and the second polymeric block B have a similar volume fraction, the first polymeric block domain A and the second polymeric block domain B are sequentially laminated to form a layered-lamellar domain. If the volume fraction of the second polymeric block B is increased, the first polymeric block A forms a regularly-arranged cylindrical domain array, and the second polymeric block B forms a polymeric matrix wrapping the cylindrical domains. If the volume fraction of the second polymeric block B further increases, the first polymeric block A forms a regularly arranged spherical domain array, and the second polymeric block B forms a polymeric matrix wrapping the spherical domains.

When the volume fraction of the first polymeric block A increases, a reversal phenomenon occurs. That is, If the volume fraction of the first polymeric block A is increased, the second polymeric block B forms a regularly-arranged cylindrical domain array, and the first polymeric block A forms a polymeric matrix wrapping the cylindrical domains. If the volume fraction of the first polymeric block A further increases, the second polymeric block B forms a regularly arranged spherical domain array, and the first polymeric block A forms a polymeric matrix wrapping the spherical domains.

According to example embodiments of the inventive concepts, it may be possible to form the pattern having a line width smaller than a minimum line width (which is realized by a photolithography process) using properties of the copolymer that forms the cylindrical domain array.

FIGS. 2A, 3A, 4A, 5A, 6A, and 7A are plane views sequentially illustrating a method of forming patterns according to example embodiments of the inventive concepts, respectively. FIGS. 2B, 3B, 4B, 5B, 6B, and 7B are sectional views taken along the lines I-I' of FIGS. 2A, 3A, 4A, 5A, 6A, and 7A, respectively.

Figure 2A:
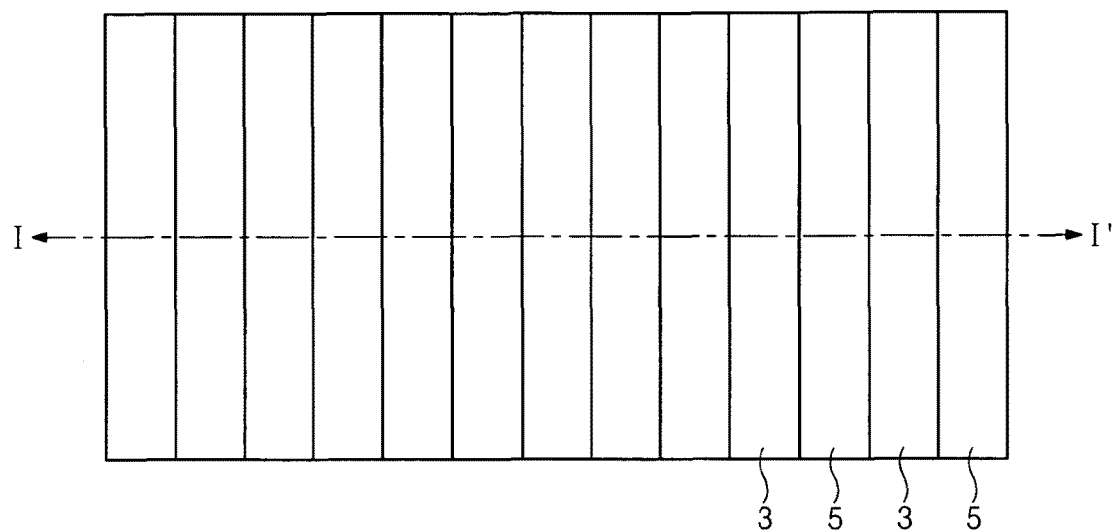
FIGS. 2A, 3A, 4A, 5A, 6A, and 7A are plane views sequentially illustrating a method of forming patterns according to example embodiments of the inventive concepts, respectively.
Figure 2B:
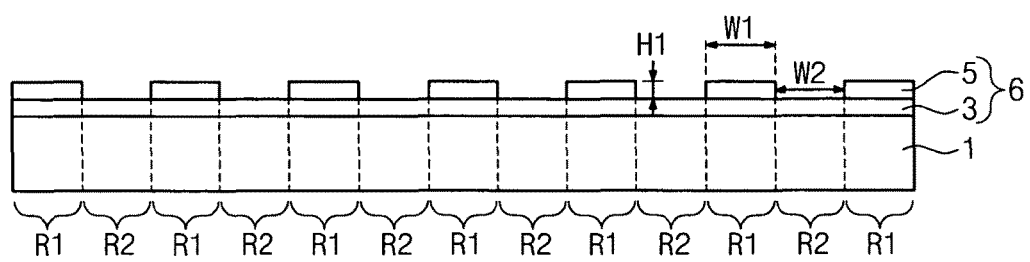
FIGS. 2B, 3B, 4B, 5B, 6B, and 7B are sectional views taken along the lines I-I' of FIGS. 2A, 3A, 4A, 5A, 6A, and 7A, respectively.

With reference to FIGS. 2A and 2B, a self-assembly induction layer 6 is formed on a substrate 1. The substrate 1 may be a semiconductor substrate, or an object layer that requires patterning (that is, intended to form the pattern). The object layer may be a gate layer, an interlayer insulating layer or a wiring layer. Although not illustrated in drawings, a hard mask layer is formed on the substrate 1, before the self-assembly induction layer 6 is formed. The hard mask layer may be formed of a silicon nitride. The self-assembly induction layer 6 may include a first region R1 and a second region R2. The self-assembly induction layer 6 may include a polar layer 3 and a neutral layer pattern 5. The polar layer 3 may be, for example, an anti-reflective layer where the surface has a polarity. The polarity may be hydrophilic. The neutral layer pattern 5 may be, for example, a single layer of a photoresist pattern, or a single layer of an imaging layer pattern, where the surface of the neutral layer pattern 5 has neutrality. The term "neutrality" means a property not having selectivity with respect to the hydrophilic nature or hydrophobic nature. The imaging layer pattern may be a layer of a hydrophilic polymer and a hydrophobic polymer that are randomly mixed. The neutral layer pattern 5 may be composed of a double (or multi) layer of the photoresist pattern and the imaging layer pattern. The neutral layer pattern 5 is located in the first region R1. An upper surface of the polar layer 3 is exposed in the second region R2. The first region R1 has a width W1 of the neutral layer pattern 5, and the second region R2 has a width W2 corresponding to the distance between the neutral layer patterns 5. The ratio of the width W2 to the width W1 may be 2n+1:1, where "n" may be an integral more than 0. At least one of the widths W1 and W2 may have a minimum line width capable of being realized by the photolithography process. In FIGS. 2A and 2B, the ratio of the width W2 to the width W1 is 1:1. The height H1 of the neutral layer pattern 5 may be less than 60-nm.

Figure 3A:
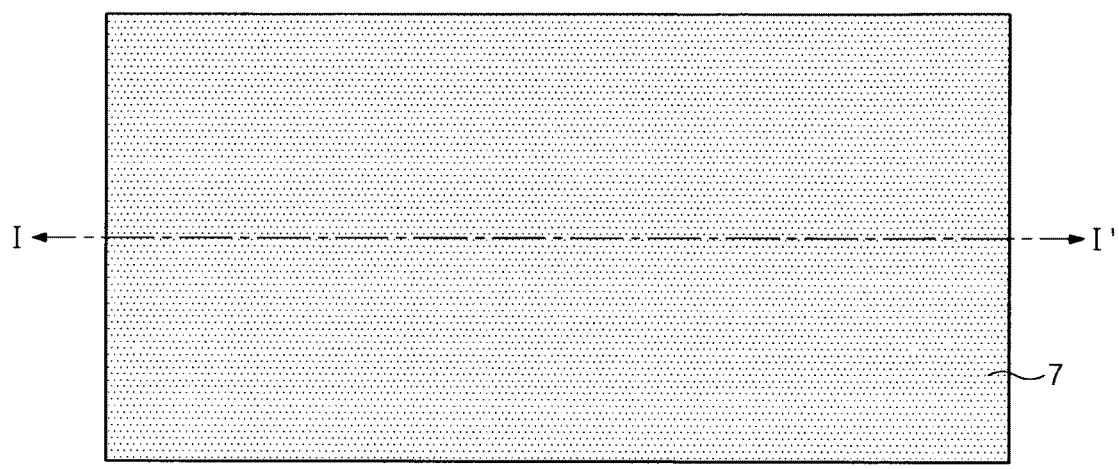
Figure 3B:
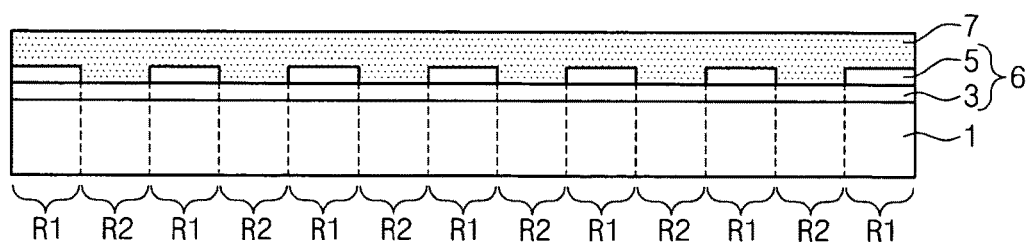

Referring to FIGS. 3A and 3B, a block copolymer layer 7 is coated on the self-assembly induction layer 6. The block copolymer layer 7 may include at least one selected from groups including polystyrene-block-polymethymethacrylate, polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polydimethylsiloxane, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethysiloxane-block-polystyrene, polystyrene-block-polyvinylpyridine-block-polystyrene, polyethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxide-block-polystyrene-block-polyethyleneoxide, polyethyleneoxide-block-polymethylmethacrylate-block-polyethyleneoxide, polyethyleneoxide-block-polydimethylsiloxane-block-polyethyleneoxide, polystyrene-block-polyethyleneoxide-block-polystyrene and combinations thereof. The selected block copolymer is molten in a solvent, and the block copolymer layer 7 is then formed, for example, using a spin coating. The solvent may be, for example, toluene. The solvent may substantially evaporate after the coating.

Figure 4A:
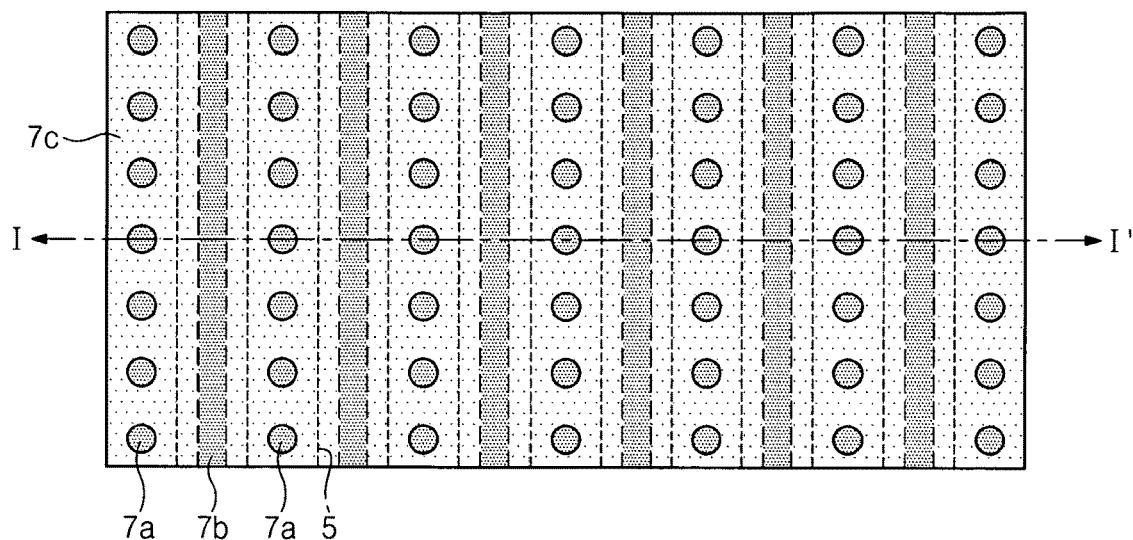
Figure 4B:
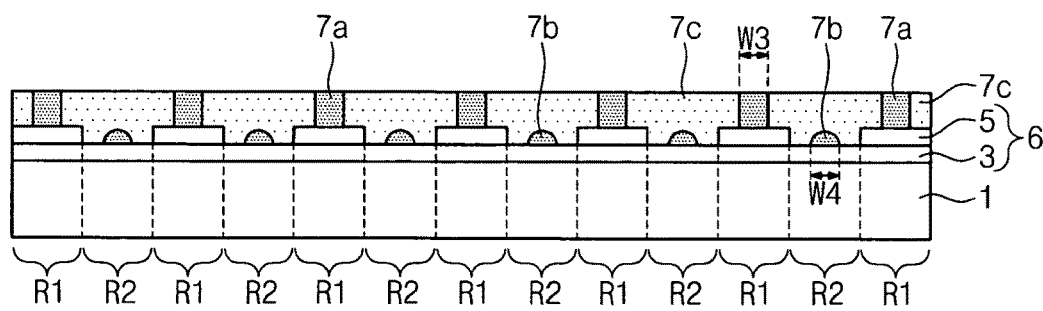

Referring to FIGS. 4A and 4B, an annealing process is performed by irradiating ultraviolet (UV) light and applying heat. The annealing process may be performed at a glass transition temperature (Tg) or more. The microphase separation occurs in the block copolymer layer 7 through the annealing process, and first, second and third patterns 7a, 7b, and 7c are formed by different surface conditions of the regions R1 and R2 of the self-assembly induction layer 6.

The first pattern 7a and the second pattern 7b are formed in the first region R1 and the second region R2, respectively. That is, the first pattern 7a is formed on the upper surface of the neutral layer pattern 5, and the second pattern 7b is formed on the upper surface of the exposed polar layer 3. The first pattern 7a and the second pattern 7b may be formed by the same polymeric block. The first pattern 7a has a vertically oriented cylindrical shape, and the second pattern 7b has a semi-cylindrical shape laid along the upper surface of the polar layer 3. The width W3 of the first pattern 7a may be equal to the width W4 of the second pattern 7b. A plurality of first patterns 7a may be arranged in a row.

The third pattern 7c may be formed by a polymeric block different from that of the first and second patterns 7a and 7b. On the self-assembly induction layer 6, the third pattern 7c covers sidewalls of the first patterns 7a and the upper surface of the second pattern 7b. The third pattern 7c may be, for example, a hydrophilic polymeric block, whereas the first and second patterns 7a and 7b may be, for example, a hydrophobic polymeric block. The columnar first pattern 7a is formed on the neutral layer pattern 5, which does not to have the selectivity with respect to the hydrophilic or hydrophobic nature. The half-columnar second pattern 7b of the hydrophobic polymeric block is formed on the polar layer 3 by acting the hydrophilic polymeric block as a matrix.

Figure 5A:
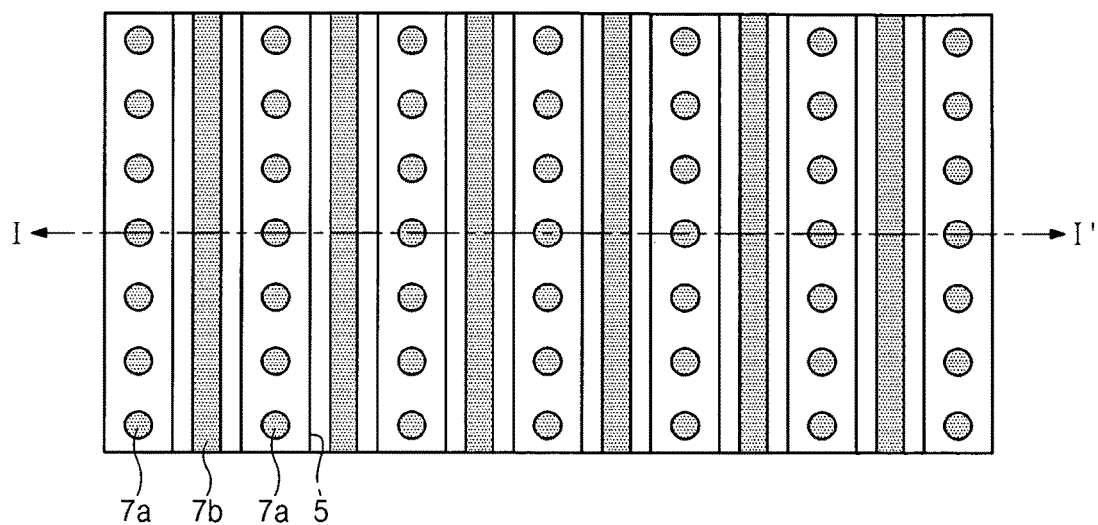
Figure 5B:
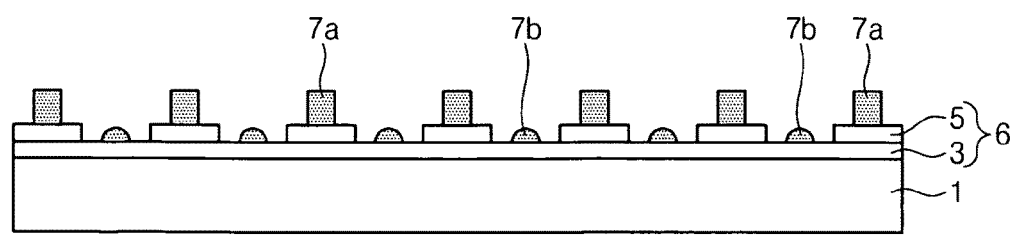

With reference to FIGS. 5A and 5B, the third pattern 7c is selectively removed. The third pattern 7c may selectively be removed by exposing to ozone, or selectively irradiating an E-beam. Alternatively, the third pattern 7c may be removed using a solvent having the selectivity with respect to the third pattern 7c. For this reason, the first and second patterns 7a and 7b and the self-assembly induction layer 6 are exposed.

Figure 6A:
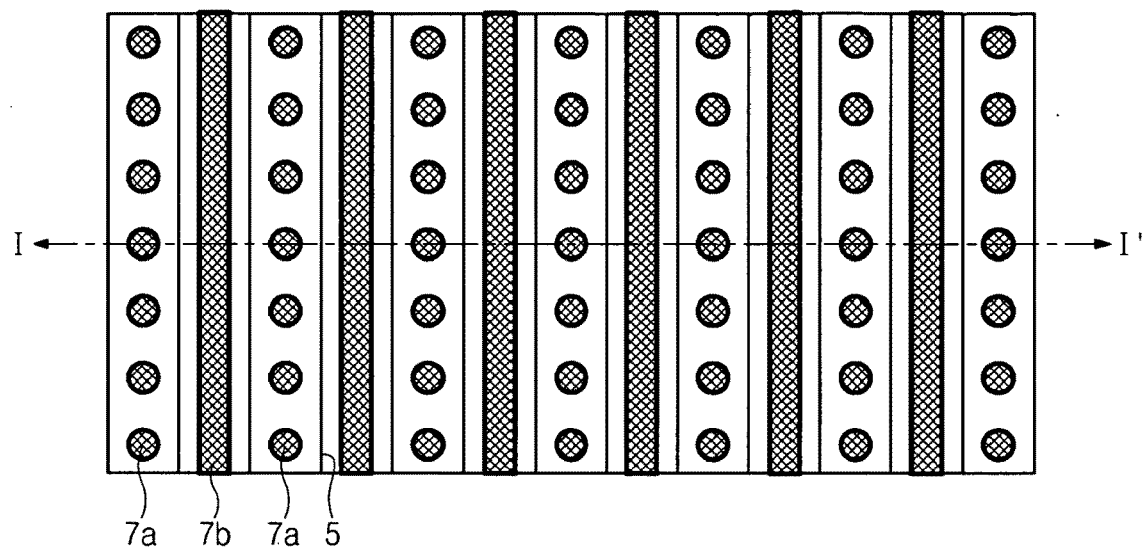
Figure 6B:
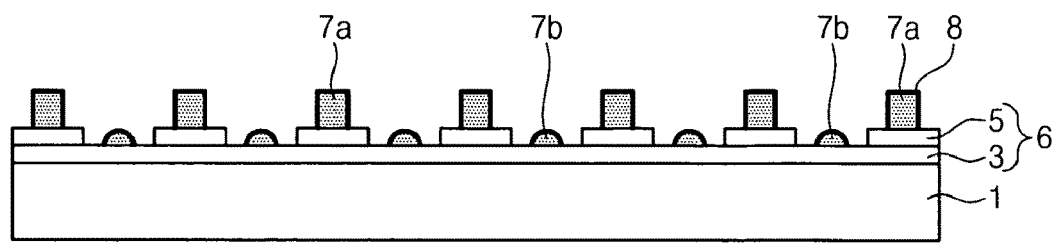

Referring to FIGS. 6A and 6B, metal particles 8 are selectively deposited on the surfaces of the first and second patterns 7a and 7b. This process may be performed using metal oxides (e.g., $RuO_4$) as a staining agent. Formation of the metal particles 8 may increase an etching resistance of the first and second pattern 7a and 7b.

Figure 7A:
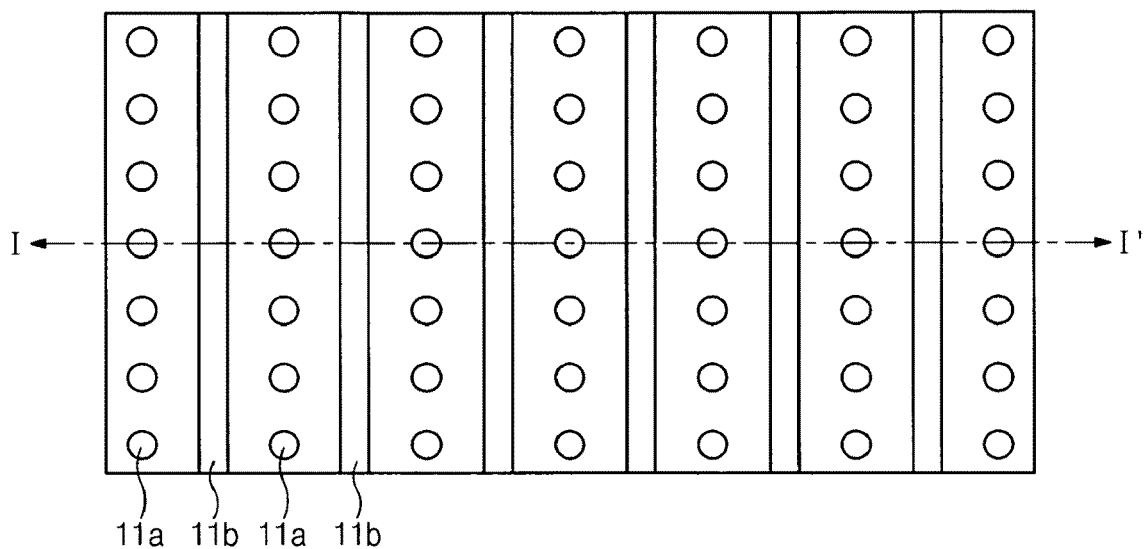
Figure 7B:
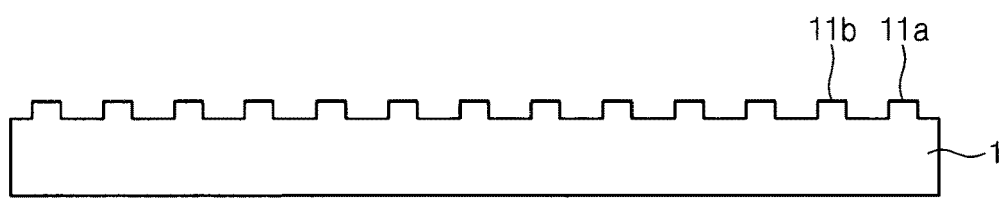

Referring to FIGS. 7A and 7B, the lower self-assembly induction layer 6 and the lower substrate 1 are etched using the first and second patterns 7a and 7b as an etching mask. When a hard mask layer (or other object layer) is presented between the self-assembly induction layer 6 and the substrate 1, a hard mask pattern may be formed by etching the hard mask layer in advance, using the first and second patterns 7a and 7b. The substrate 1 may be etched using the hard mask pattern as an etching mask.

Through the etching process, an island-type pattern 11a and a line-type pattern 11b are formed so as to protrude from the substrate 1. The island-type pattern 11a may be called by a pillar-type pattern. When the etching-object layer of the substrate 1 is a gate layer, a gate line pattern may be formed in this way. After the etching process is finished, the remaining self-assembly induction layer 6 and the remaining first and second pattern 7a and 7b may be removed. The width of the island-type pattern 11a may be almost equal, or similar to, the width W3 of the first pattern 7a. The width of the line-type pattern 11b may be almost equal, or similar, to the width W4 of the second pattern 7b. Through these processes, it is possible to form a fine pattern having a width smaller than a minimum line width realized by a photolithography process.

Figure 8A:
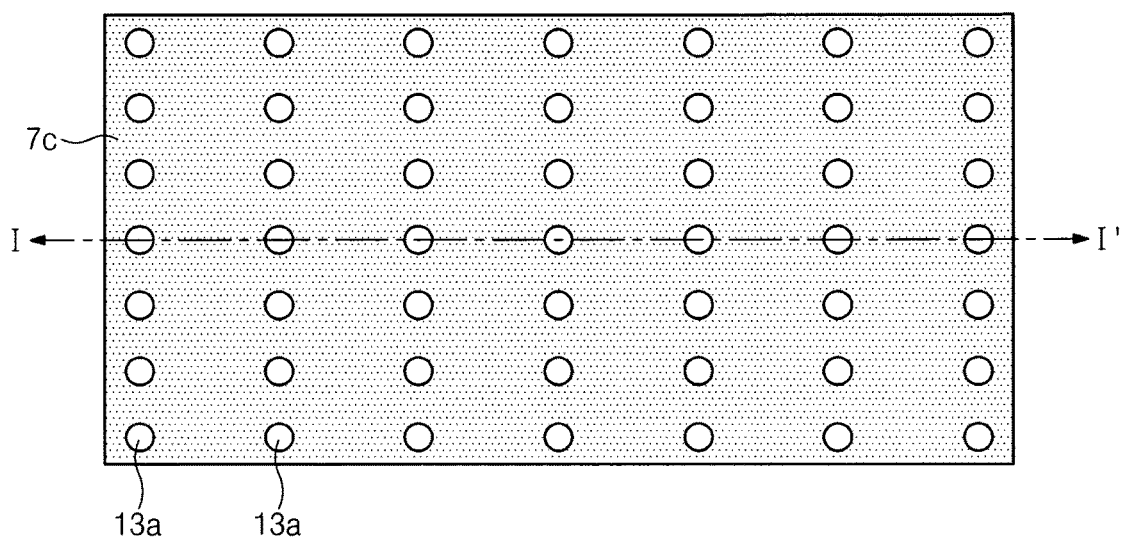
FIGS. 8A, 9A, and 10A are plane views sequentially illustrating a method of forming patterns according to example embodiments of the inventive concepts, respectively.
Figure 8B:
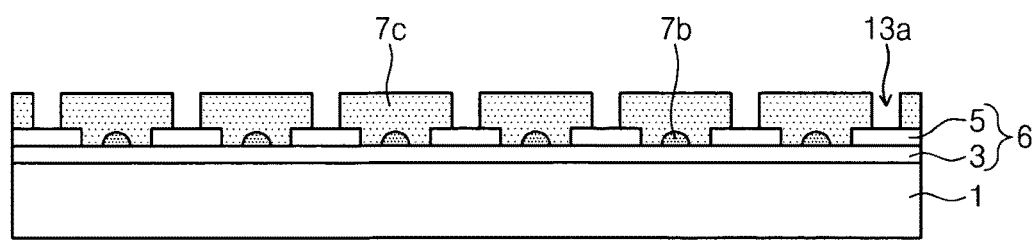
FIGS. 8B, 9B, and 10B are sectional views taken along the lines I-I' of FIGS. 8A, 9A, and 10A, respectively.
Figure 9A:
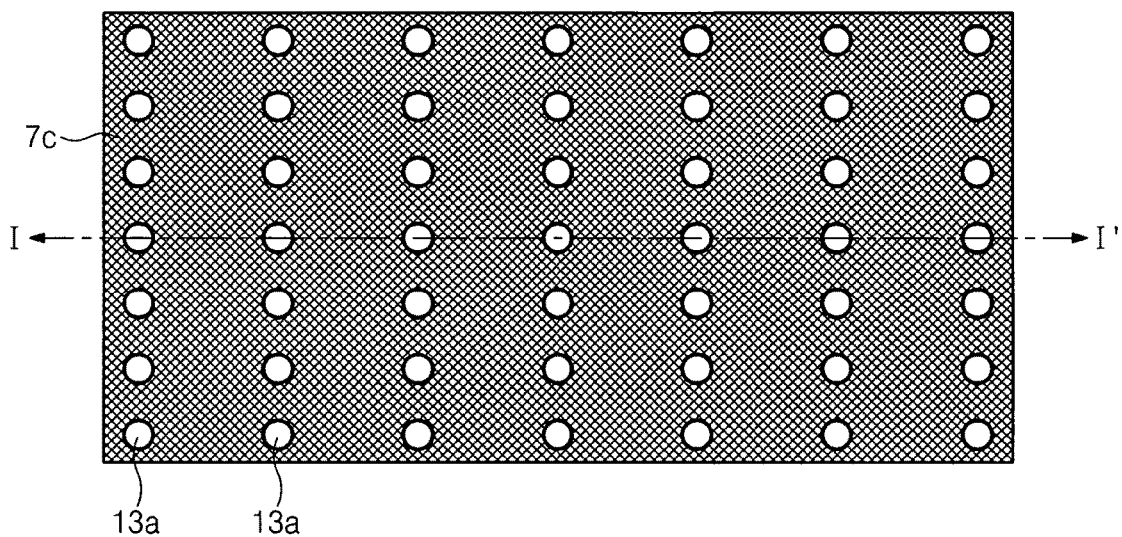
Figure 9B:
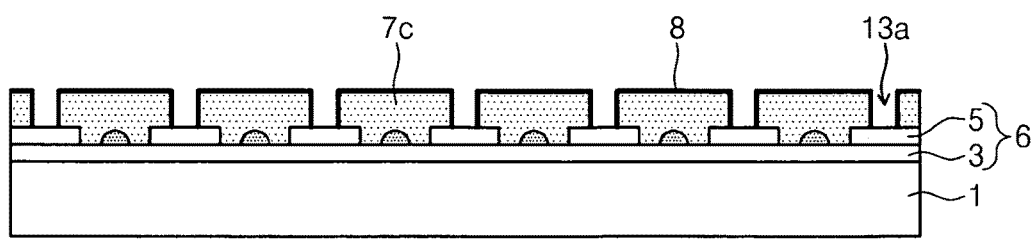
Figure 10A:
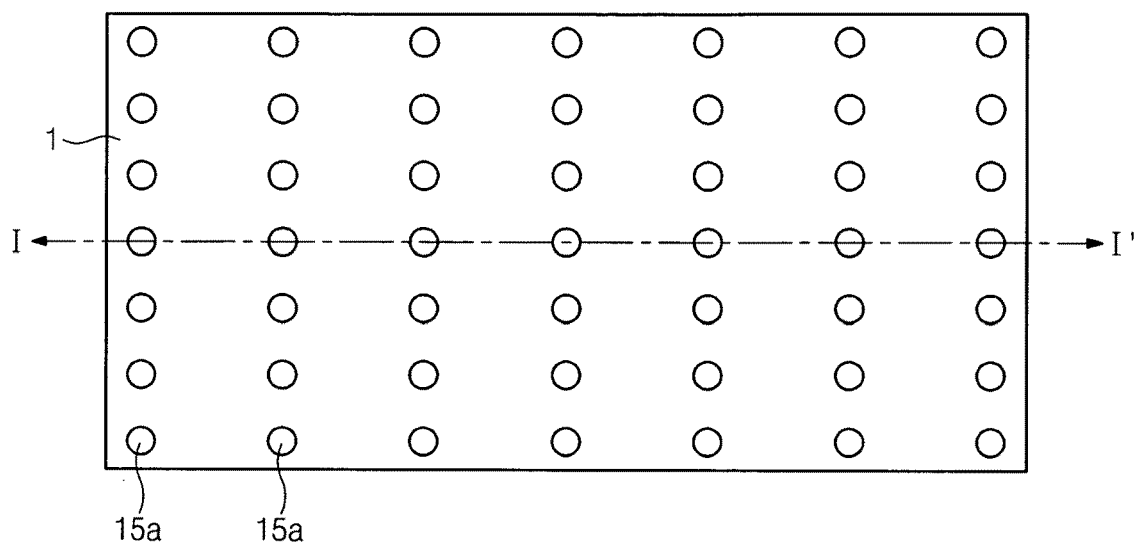
Figure 10B:
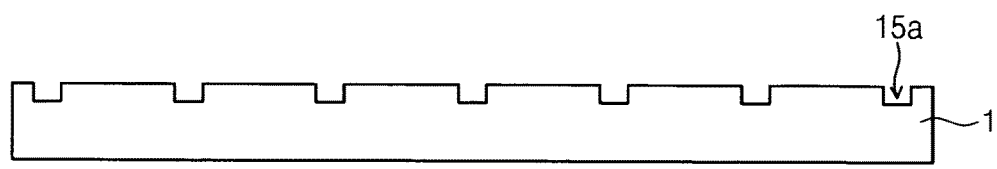

FIGS. 8A, 9A, and 10A are plane views sequentially illustrating a method of forming patterns according to example embodiments of the inventive concepts, respectively. FIGS. 8B, 9B, and 10B are sectional views taken along the lines I-I' of FIGS. 8A, 9A, and 10A, respectively.

Referring to FIGS. 8A and 8B, the first pattern 7a is removed in the process described with reference to FIGS. 4A and 4B. The second pattern 7b is not removed. Alternatively, the second pattern 7b may also be removed. The third pattern 7c may not be removed but remain. For this reason, a first hole 13a may be formed at the place in which the first pattern 7a is located. The first hole 13a exposes a part of the neutral layer pattern 5. A second hole (not shown) may be formed at the place in which the second pattern 7b is located.

Referring to FIGS. 9A and 9B, metal particles are selectively deposited on the surface of the third pattern 7c, as described in the above example embodiments of the inventive concepts, to increase the etching resistance of the third pattern 7c.

Referring to FIGS. 10A and 10B, the etching process is performed using the third pattern 7c as an etching mask. This causes a sequential patterning of the self-assembly induction layer 6 exposed by the first hole 13a and the substrate 1 disposed below the self-assembly induction layer 6. Contact holes 15a corresponding to the first holes 13a are formed on the substrate 1. The width of the contact hole 15a may be formed so as to be almost equal, or similar, to the width W3 of the first pattern 7a. As such, it is possible to form the contact holes 15a having the width smaller than the minimum line width realized by a photolithography process.

Figure 11:
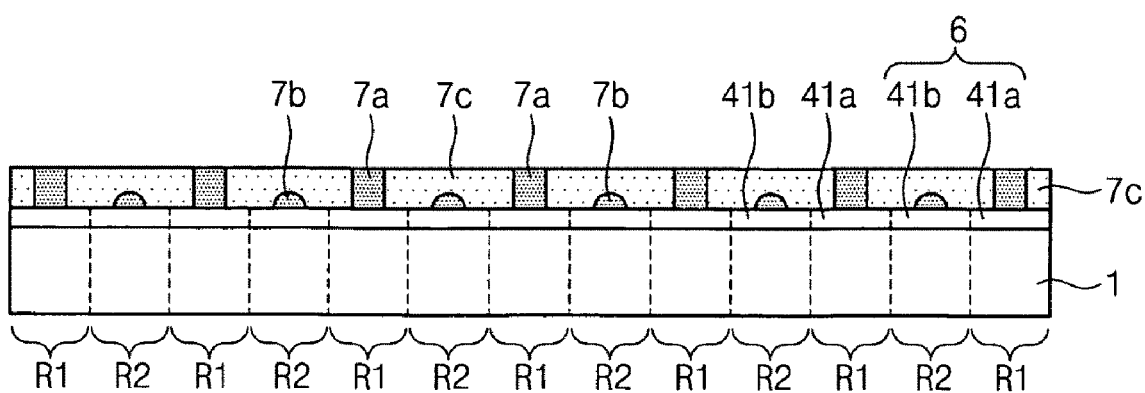
FIG. 11 is a sectional view illustrating processes in a method of forming patterns according to example embodiments of the inventive concepts.

FIG. 11 is a sectional view illustrating processes in a method of forming patterns according to example embodiments of the inventive concepts.

Referring to FIG. 11, the self-assembly induction layer 6 may be formed so as to include a first photoresist pattern 41a and a second photoresist pattern 41b. In example embodiments of the inventive concepts, a method of forming the self-assembly induction layer 6 changes the surface property of the photoresist layer receiving light so as to be different from the surface property of the photoresist not receiving light through an exposure process after the neutral photoresist layer is formed on the substrate 1. A portion receiving the light is different for each of the regions R1 and R2. For example, the light is transmitted in the second region R2, whereas the light is obstructed using a photomask. For this reason, when the photoresist layer is a chemically amplified positive-type resist, the property of the portion receiving the light is changed into the polarity capable of being molten in a developing solution. As a result, it is possible to form the first photoresist pattern 41a not receiving the light and the second photoresist pattern 41b of which the surface property is changed into the polarity by receiving the light. Subsequently, without a developing process, the block copolymer 7 is coated on the first and second photoresist patterns 41a and 41b as described with reference to FIGS. 3A and 3B and then subjected to the phase separation, thereby forming the first, second and third patterns 7a, 7b, and 7c.

According to example embodiments of the inventive concepts, the upper surface of the self-assembly induction layer 6 may be substantially flat without a stepped portion. For this reason, when actual patterns are formed by etching the self-assembly induction layer 6 and the substrate 1 using the first, second and third patterns 7a, 7b, and 7c as an etching mask, the lower profiles of the patterns may be uniformly and evenly formed. Subsequent processes may be equal to those of the above example embodiments of the inventive concepts.

Figure 12A:
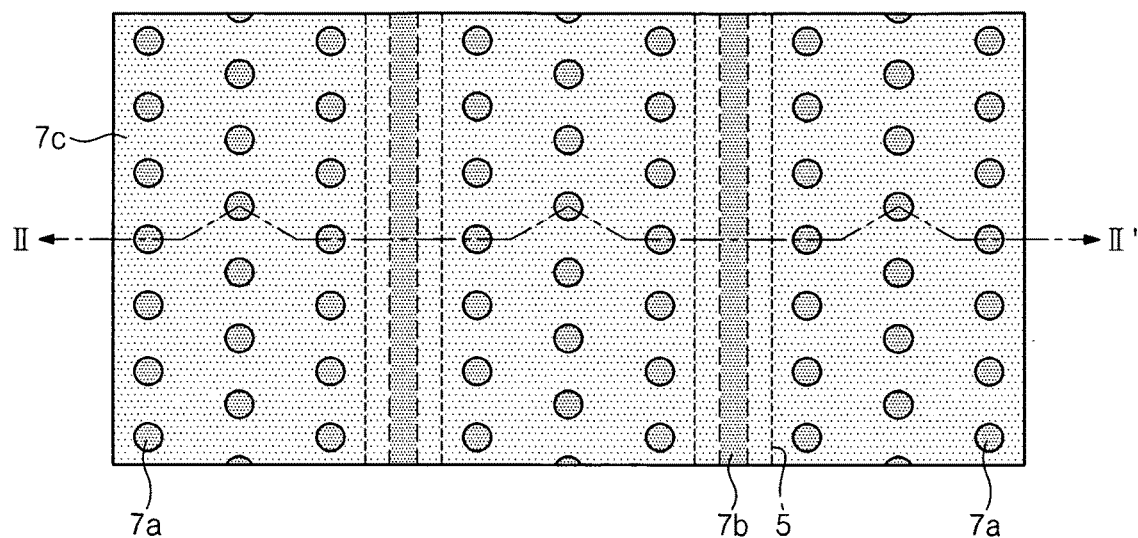
FIG. 12A is a plane view illustrating processes in a method of forming patterns according to example embodiments of the inventive concepts.
Figure 12B:
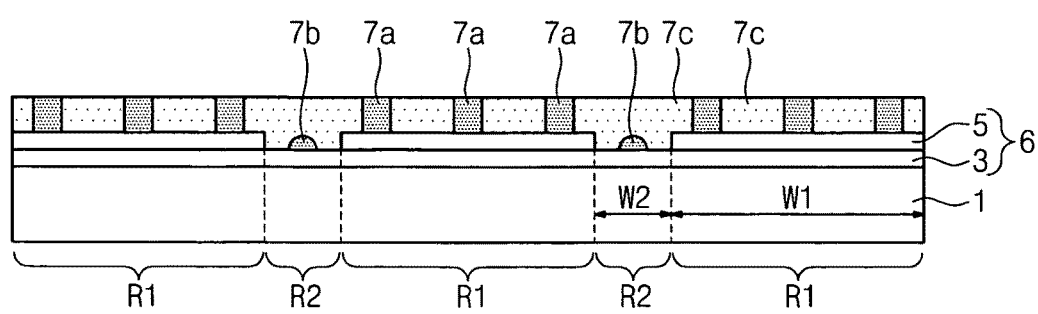
FIG. 12B is a sectional view taken along the line II-II' in FIG. 12A.

FIG. 12A is a plane view illustrating processes in a method of forming patterns according to example embodiments of the inventive concepts. FIG. 12B is a sectional view taken along the line II-II' in FIG. 12A.

Referring to FIGS. 12A and 12B, the self-assembly induction layer 6 is formed so as to include the polar layer 3 and the neutral layer pattern 5. The neutral layer pattern 5 is disposed in the first region R1, and the polar layer 3 is exposed between the neutral layer patterns 5 in the region R2. At this time, the ratio of the width (alternatively, the width W1 of the first region R1) of the neutral layer pattern 5 to the width W2 of the second region R2 is approximately 3:1. Subsequently, the block copolymer 7 is coated as described with reference to FIG. 3B and then subjected to the phase separation, thereby forming the first, second and third patterns 7a, 7b and 7c. At this time, the first patterns 7a are arranged along three parallel lines on the neutral layer pattern 5, respectively, and have a plurality of vertically extending cylindrical shapes spaced apart from one another. Meanwhile, the second pattern 7b is formed so as to have a semi-cylindrical shape laid on the polar layer 3 exposed between the neutral layer patterns 5. Subsequently, actual patterns may be formed through the processes described in the above example embodiments of the inventive concepts. Although the first patterns 7a are shown disposed along three parallel lines in example embodiments of the inventive concepts, example embodiments are not limited thereto. For example, the first patterns 7a may be disposed along one or two parallel line(s) according to a molecular weight.

Even though the ratio of the width (alternatively, the width W1 of the first region R1) of the neutral layer pattern 5 to the width W2 of the second region R2 is approximately 3:1 in the above example embodiment of the inventive concepts, when the this ratio is changes (e.g., into 5:1 or 7:1), the arrangement and the number of the first patterns 7a, which are formed on the neutral layer pattern 5 may be changed.

Figure 13:
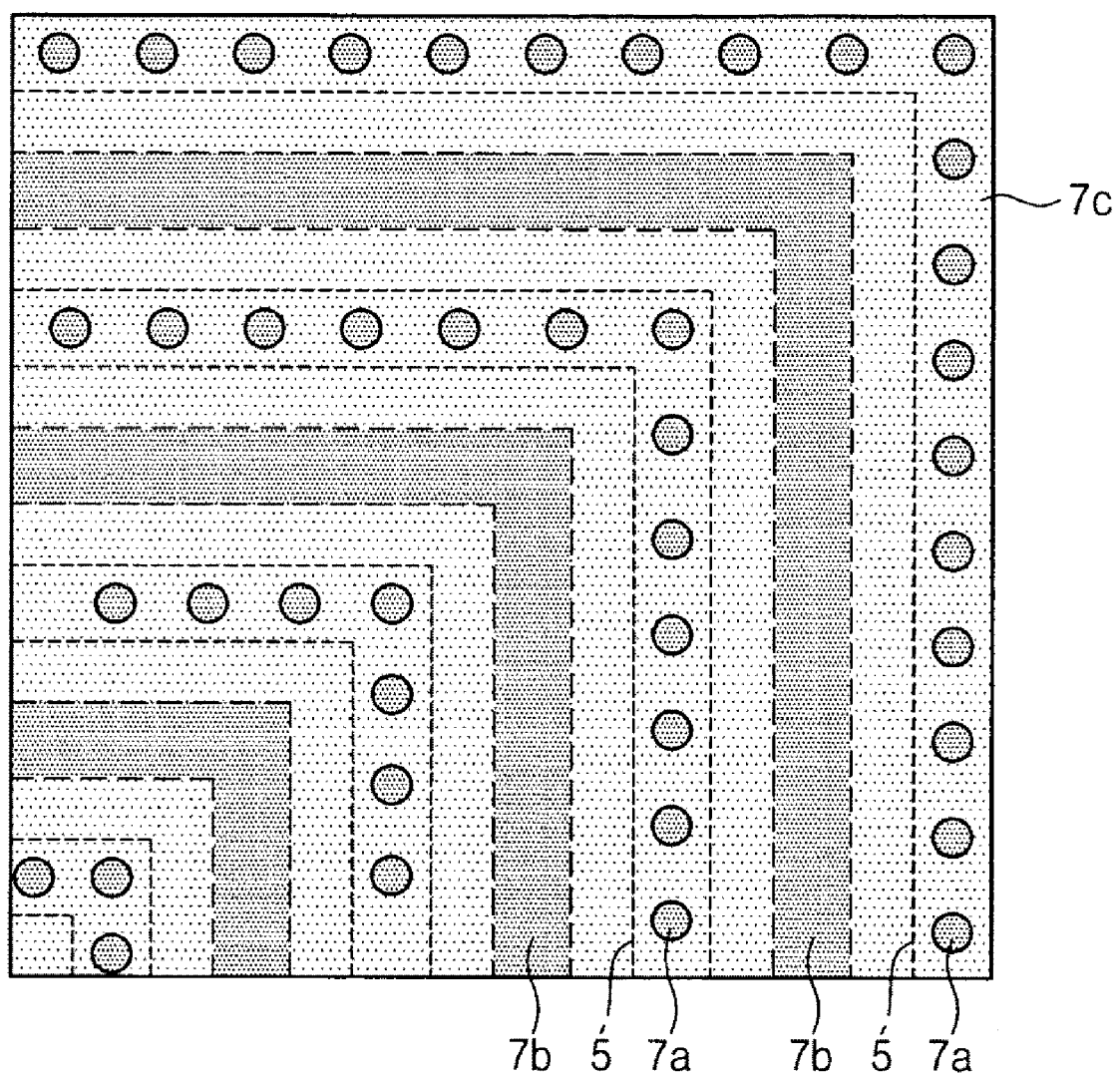
FIG. 13 is a plane view illustrating processes in a method of forming patterns according to example embodiments of the inventive concepts.

FIG. 13 is a plane view illustrating processes in a method of forming patterns according to example embodiments of the inventive concepts.

Referring to FIG. 13, the neutral layer patterns 5 according to example embodiments of the inventive concepts may be bent. In this case, the second patterns 7b, which are formed between the neutral layer patterns 5, may also be bent along a plane profile. The section of the second pattern 7b may have a half-circle as described in the above example embodiments of the inventive concepts. The first patterns 7a, which are formed on the neutral layer patterns 5, have a vertically extending cylindrical shape, respectively, and may be disposed along bent lines. Through the process described in the above example embodiments of the inventive concepts, when actual patterns are formed by the etching process using at least one of the first, second and third patterns 7a, 7b and 7c as an etching mask, these bent profiles may be transcribed into the actual patterns.

In the above example embodiments of the inventive concepts, the distance between the first and second patterns 7a and 7b may be equal. That is, the distance between the second pattern 7b and the first pattern 7a adjacent to the second pattern 7b may be equal to that between the adjacent first patterns 7a located in the first region R1.

Experimental Example

An anti-reflective layer was formed on a semiconductor substrate to have a polarity. A neutral imaging layer was formed on the anti-reflective layer. The imaging layer is a random copolymer layer of polystyrene and polymethylmethacrylate. An ArF photoresist was formed on the imaging layer, and then an ArF photoresist pattern was formed by exposing and developing processes such that the ratio of bar to space is 3:1 (105 nm:35 nm). The imaging layer next to the photoresist pattern was etched by using the photoresist pattern as an etching mask and supplying oxygen plasma as an etching gas. For this reason, the polar anti-reflective layer disposed below the imaging layer was exposed. The photoresist pattern was removed. As such, the self-assembly induction layer was formed so as to have alternately polarity and neutrality.

Subsequently, the block copolymer layer was formed through following processes. First, two polystyrene-block-polymethylmethacrylates (PS-block-PMMAs) having different molecular weights were prepared as a di-block copolymer. That is, PS-block-PMMA1 (molecular weight of PS block: 46 kg/mol, molecular weight of PMMA block: 21 kg/mol) and PS-block-PMMA2 (molecular weight of PS block: 140 kg/mol, molecular weight of PMMA block: 60 kg/mol) were mixed so that the ratio is 9:1 to 0:10 as listed in Table 1 and then melted in a solvent of toluene. The distance between the centers of the first and second patterns formed in each of the cases was listed in Table 1.

TABLE 1

| | CASE | | | | | | | | | |
|---|---|---|---|---|---|---|---|---|---|---|
| | 1 | 2 | 3 | 4 | 5 | 6 | 7 | 8 | 9 | 10 |
| PS-BLOCK-PMMA1:PS-BLOCK-PMMA2 | 9:1 | 8:2 | 7:3 | 6:4 | 5:5 | 4:6 | 3:7 | 2:8 | 1:9 | 0:10 |
| DISTANCE BETWEEN CENTERS (nm) | 38.9 | 42 | 44.5 | 48.8 | 53.4 | 56.9 | 60.3 | 63 | 67.7 | 70 |

This experimental example obtained a preferable result from cases 2, 5, 9, and 10.

Figure 14:
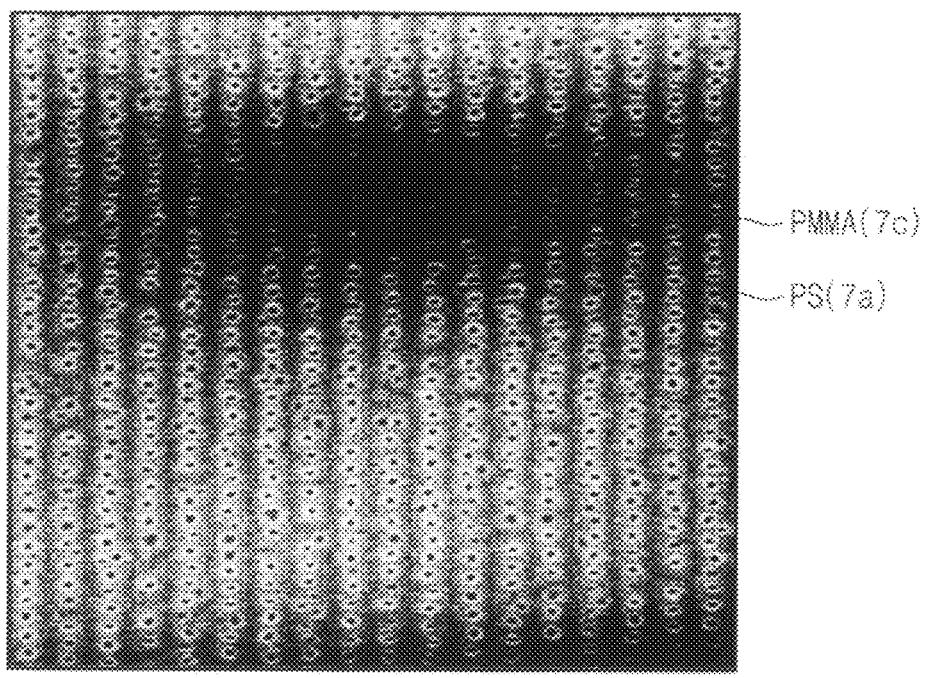
FIG. 14 is a SEM photograph of a pattern formed depending on a case 5 in an experimental example.
Figure 15:
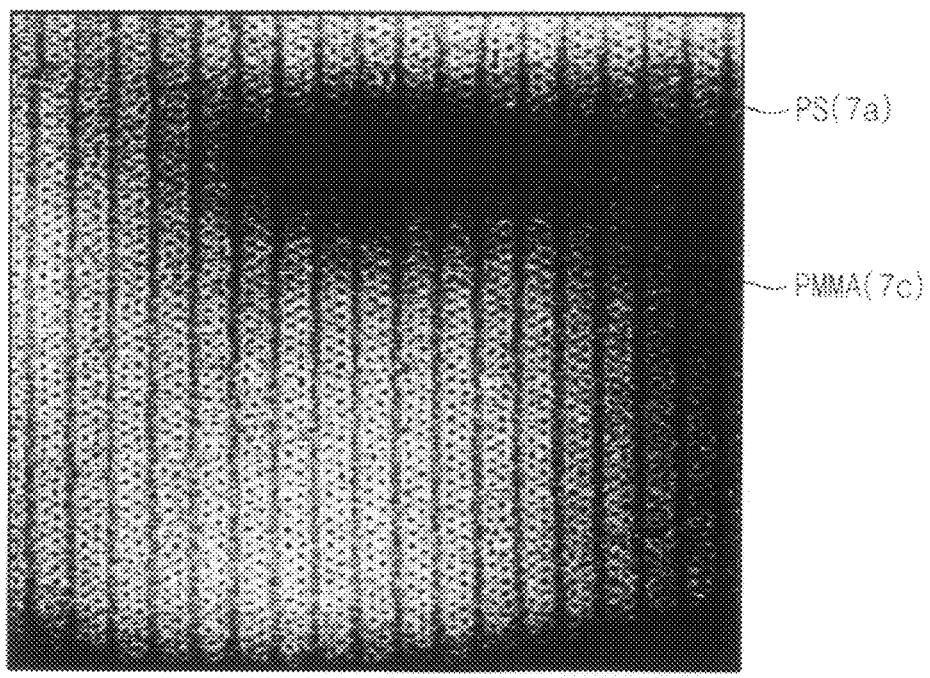
FIG. 15 is a SEM photograph of a pattern formed depending on a case 10 in an experimental example.

FIGS. 14 and 15 are SEM photographs patterns formed depending on cases 5 and 10, respectively. The size of each photograph is 2.5 μm×2.5 μm.

Referring to FIGS. 14 and 15, the first patterns 7a composed of PS are arranged along the lower imaging layer pattern. The third pattern 7c composed of PMMA is seen between the first patterns 7a. The second pattern 7b covered with the third pattern 7c is not seen.

As described above, the actual patterns are realized by the experimental examples, and the pattern formed by the experimental example may have the width of 17-nm. As a result, it is possible to realize the pattern having the line width smaller than the minimum line width capable of being realized by a photolithography process.

According to example embodiments of the inventive concepts, the block copolymer layer is formed on the self-assembly induction layer including the first region and second region having different surface properties and subjected to the phase separation, thereby forming the columnar first pattern and the half-columnar second pattern laid on the polar layer. The line width of each of the first and second regions may be the minimum line width capable of being realized by a photolithography process. The first pattern and the second pattern may be formed in the first region and second region, respectively, so as to have the line widths smaller than those of the first and second regions. A desired pattern may be formed using the first and second patterns as an etching mask. As a result, it may be possible to form a fine pattern having the line width smaller than the minimum line width capable of being realized by a photolithography process. In addition, it may be possible to form simultaneously the line-type pattern and the island-type pattern.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of forming a pattern, comprising:
    forming a self-assembly induction layer including a first region and a second region on a semiconductor substrate;
    coating a block copolymer layer on the self-assembly induction layer;
    forming a first pattern, a second pattern and a third pattern by phase separating the block copolymer;
    removing at least one of the first, second and third patterns to form a preliminary pattern; and
    performing an etching process using the preliminary pattern as an etching mask,
    wherein the first pattern contains the same material as that of the second pattern, and the third pattern contains a material different from that of the first pattern.

2. The method of claim 1, wherein the self-assembly induction layer has different properties in the first region and the second region.

3. The method of claim 2, wherein a first portion of a surface of the self-assembly induction layer has a neutrality, and a second portion of the surface of the self-assembly induction layer has a polarity, the first portion being in the first region and the second portion being in the second region.

4. The method of claim 1, wherein forming the self-assembly induction layer includes:
    forming a polar layer on an entire surface of the semiconductor substrate; and
    forming a neutral layer pattern which is disposed in the first region and exposes the polar layer in the second region, and
    wherein the self-assembly induction layer includes the polar layer and the neutral layer pattern.

5. The method of claim 4, wherein the neutral layer pattern has a height of about 60-nm or less.

6. The method of claim 4, wherein the neutral layer pattern includes at least one of a photoresist pattern and an imaging layer pattern.

7. The method of claim 1, prior to performing the etching process, further comprising:
    performing an annealing process on a surface of the preliminary pattern; and
    selectively depositing metal particles on the annealed surface of the preliminary pattern.

8. The method of claim 1, wherein the first pattern is formed in the first region and has a width smaller than that of the first region, and
    the second pattern is formed in the second region and has a width smaller than that of the second region.

9. The method of claim 8, wherein the first pattern has a cylindrical shape extending upward from a surface of the self-assembly induction layer, and
    wherein the second pattern has a semi-cylindrical shape in contact with the surface of the self-assembly induction layer.

10. The method of claim 9, wherein the third pattern covers an upper surface of the second pattern and sidewalls of the first pattern, and exposes an upper surface of the first pattern.

11. The method of claim 1, wherein the first region has a first width, and the second region has a second width, and
    the ratio of the first width to the second width is $2n+1:1$, where n is an integer of 0 or more.

12. The method of claim 1, wherein the block copolymer layer is at least one selected from a group including polystyrene-block-polymethymethacrylate, polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polydimethylsiloxane, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethysiloxane-block-polystyrene, polystyrene-block-polyvinylpyridine-block-polystyrene, polyethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxideblock-polystyrene-block-polyethyleneoxide, polyethyleneoxide-block-polymethylmethacrylate-block-polyethyleneoxide, polyethyleneoxide-block-polydimethylsiloxane-block-polyethyleneoxide, polystyrene-block-polyethyleneoxide-block-polystyrene and combinations thereof.

13. The method of claim 1, wherein removing the at least one of the first, second and third patterns includes removing the third pattern or simultaneously removing the first pattern and the second pattern.

14. The method of claim 1, wherein the preliminary pattern includes the third pattern, and
a plurality of holes are formed by using the third pattern as the etching mask in the etching process.

15. The method of claim 1, wherein the preliminary pattern includes the second pattern, and
a line-type lower pattern is formed by using the second pattern as the etching mask in the etching process.

16. The method of claim 1, wherein the preliminary pattern includes the first pattern, and
a pillar-type lower pattern is formed by using the first pattern as the etching mask in the etching process.

17. The method of claim 1, wherein the first pattern and the second pattern have equal widths.

18. A method of forming a semiconductor device having a pattern, comprising:
forming, and subsequently patterning, an object layer on a semiconductor substrate, wherein patterning the object layer includes,
forming a self-assembly induction layer including a first region and a second region on the semiconductor substrate,
coating a block copolymer layer on the self-assembly induction layer,
forming a first pattern, a second pattern and a third pattern by phase separating the block copolymer, wherein the first pattern contains the same material as that of the second pattern, and the third pattern contains a material different from that of the first pattern,
removing at least one of the first, second and third patterns to form a preliminary pattern, and
performing an etching process using the preliminary pattern as an etching mask.

19. The method of claim 18, wherein the object layer is one selected from the group consisting of a gate interlayer, an interlayer insulating layer and a wiring layer.

20. The method of claim 18, wherein the semiconductor substrate includes the object layer.

* * * * *